US005663922A

United States Patent [19]
Tailliet

[11] Patent Number: 5,663,922
[45] Date of Patent: Sep. 2, 1997

[54] METHOD FOR THE ANTICIPATED READING OF SERIAL ACCESS MEMORY, AND MEMORY PERTAINING THERETO

[75] Inventor: François Tailliet, Epinay sur Seine, France

[73] Assignee: SGS-Thomson Microelectronics S.A., Saint Genis, France

[21] Appl. No.: 552,996

[22] Filed: Nov. 3, 1995

[30] Foreign Application Priority Data

Nov. 10, 1994 [FR] France ................. 94 13672

[51] Int. Cl.⁶ ................................ G11C 8/04
[52] U.S. Cl. ................... 365/240; 365/239; 365/221; 365/189.02; 365/189.12; 365/230.03; 365/236; 365/184
[58] Field of Search ............... 365/221, 189.02, 365/189.12, 230.03, 236, 239, 240, 184

[56] References Cited

U.S. PATENT DOCUMENTS 5,091,851  2/1992  Shelton et al. ................. 395/425
5,093,805  3/1992  Singh ............................. 365/51
5,450,367  9/1995  Butler et al. ................. 365/230.05

FOREIGN PATENT DOCUMENTS 0 299 697  1/1989  European Pat. Off. ......... G11C 8/00

OTHER PUBLICATIONS

French Search Report from French Patent Application 94 13672, filed Nov. 10, 1994.

*Primary Examiner*—David C. Nelms
*Assistant Examiner*—Andrew Q. Tran
*Attorney, Agent, or Firm*—Wolf, Greenfield & Sacks, P.C.; James H. Morris

[57] ABSTRACT

A method and apparatus for reading a memory, such that the address decoding is started when the address bits have not yet all been received. All the information elements corresponding to the partially decoded address are extracted and, when the last address bits have been received, the information element corresponding to the complete address is selected. The maximum permissible time for extracting an information element is thus increased internally, while this period of time external to the memory remains the same for a given frequency.

23 Claims, 2 Drawing Sheets

METHOD FOR THE ANTICIPATED READING OF SERIAL ACCESS MEMORY, AND MEMORY PERTAINING THERETO

BACKGROUND OF THE INVENTION

1. Field of the Invention

The invention relates to serial access memories. More particularly, it relates to electrically erasable programmable read-only memories (EEPROMs), although it can be applied to other types of volatile or non-volatile memories.

2. Discussion of the Related Art

The current development of memories in integrated circuit form with very large information storage capacities (in terms of the number of information elements stored) is being accompanied by the desire to increase the frequencies of the clock signal that sets the rate of operation of the systems in which these memories are implemented. Consequently, there is also a search for increasingly shorter times for gaining access to the contents of the words stored in these memories. The term "word" is understood to mean a physical entity whose contents represent a binary information element encoded on b bits, where b is an integer. Typically, these words will be formed by b elementary storage cells, each elementary cell being typically formed by a storage circuit.

From the viewpoint of access time, parallel access memories are the most advantageous ones. A period corresponding to one cycle of the clock signal that sets the rate of operation of such a memory is enough to provide one of these memories, in parallel, with the address of the word whose contents are to be read.

Nevertheless, serial access memories also have definite advantages as compared with parallel access memories, such as lower manufacturing cost, and overall have appreciably smaller bulk and weight. Indeed, serial access memories require a far smaller number of connection pins. The number of connection pins for an integrated circuit greatly affects the mount of space taken up by the circuit. Consequently, serial access memories are very valuable in portable applications.

It would be desirable to be able to increase the clock signal frequencies and the storage capacities of serial access memories. The best performing products at present have capacities of 64 kilobits and work at frequencies in the range of 1 megahertz. In the near future, capacities of the order of 256 kilobits and frequencies in the range of 5 megahertz and more can be envisaged.

In practice, increasing the clock signal frequencies of these memories raises technical problems essentially related to the time of access, in read mode, of the contents of the words stored in the memories. The term "access time" is understood to mean the period, between the point in time when the address of a word is known to the memory (namely the point in time when all the address bits of this word have been received serially by the memory), and the point in time when the binary information that the contents of the cells that the word represent starts being available (if the memory is a series output memory), or is available (if the memory is a parallel output memory or if the information elements are encoded on one bit), outside the memory by means of one or more output pins.

The access time is limited by the time needed to sequence the following two steps:

decoding of the address received by the memory, specifically the positioning of various switch-over devices that connect a read circuit to the word whose contents represent the binary information to be read, and the reading process, i.e., the extraction of the binary information in the form of logic signals according to the word read (the cells of the word do not necessarily store a directly usable logic information element but more generally have a variable physical characteristic that an appropriate circuit, for example a differential amplifier, will convert into a logic signal).

In a standard way the address, which is encoded on a certain number of bits, is received serially in a shift register. This process lasts for as many clock signal cycles as there are address bits to be received.

The maximum permissible access time is often equal to the duration of an odd number of clock signal half-cycles. For example, this access time is set at three half-cycles if the memory is connected to a Microwire or I2C type bus and is set at one half-cycle if the memory is connected to an SPI bus.

The type of bus by which the memory communicates with other devices therefore sets the maximum permissible access time for a given clock signal frequency. For example, if it is desired to use an SPI bus and a clock signal frequency of 2 megahertz, the permissible access time is limited to 250 nanoseconds, which corresponds to a level of performance close to those devices for reading fast parallel access memories.

There are, however, technical difficulties of construction inherent in the required switch-over speeds. The circuits used are often high power consumption circuits. This is hardly desirable for memories that are often designed for portable applications for which a minimum level of power consumption is sought. In practice, therefore, the frequency of the clock signal and the type of bus used determine the maximum permissible access time.

SUMMARY OF THE INVENTION

One object of the invention is to provide a method of reading and an organization of serial access memories that combines technical simplicity with low power consumption and is functionally similar to the standard reading method and the standard organization of a known type of serial access memory.

The invention thus, in one embodiment, proposes a method of reading the contents of the words of a memory in integrated circuit form, each memory being organized in matrix form in words, the contents of each word representing a binary information element, each word being accessible at a particular address encoded in binary mode on k bits, k being an integer greater than 1. The address bits are received in series by the memory at an address input terminal. The reading of the contents of the word comprises the following steps:

the series reception of the q first bits of the address of the word to be read, q being an integer smaller than k, in parallel with the reception of k–q last bits of the address:

the decoding of the q first bits of the address that are received and the connection of read circuits to the words for which the q first address bits correspond to the q first address bits received, the extraction of the binary information elements represented by the contents of said words, and the decoding of the k–q last bits of the address of the word to be read, and supplying at a data output terminal of the memory, the binary information element that is represented by the contents of the word whose address bits correspond to the k address bits received.

According to the invention, it is proposed to start the address decoding and reading while the address bits have not yet all been received. Thus, an internal increase is achieved in the maximum permissible access time (the maximum time for the address decoding and the reading of the words) in terms of the number of half-cycles of a clock signal. The maximum permissible access time remains identical for a given frequency. The access time is therefore no longer dictated by the duration of implementation of the address decoding and reading operations but may be smaller than this duration. This allows an increase in the permissible clock signal frequency for an identical maximum access time. Furthermore, since the decoding will start while all the address bits have not yet been received, several read circuits will be activated in parallel in order to extract the information from all the words whose address bits correspond to the bits received when the decoding starts. The information to be output will be selected once the full address is known. There will then be a simple rerouting operation that is brief compared with the decoding and reading operationsl. The access time is then chiefly limited by the slowness of similar operations such as the use of read amplifiers.

The invention also relates to a memory in integrated circuit form organized in words, the contents of each word representing a binary information element. Each word is accessible at a particular address encoded in binary mode on k bits, k being an integer greater than 1. The memory comprises an address input terminal to receive the address bits in series, a data output terminal to give the binary information elements corresponding to the contents of the addressed words, an input register to store received address bits received, circuits for decoding the received address bits, and circuits for connection of the words to the read circuits. The words are organized in groups in such a way that the words in each group have k–q identical last address bits, with q being an integer smaller than k, and q first distinct address bits. Each group of words has an associated read circuit so that, when the memory receives k address bits, it extracts the binary information that is represented by the contents of the word of the group corresponding to the q first address bits received. The memory comprises control and output multiplexing circuits to supply, at the data output terminal, the binary information that is represented by the contents of the word whose address corresponds to the k bits received.

Such a memory implements the above method. As compared with a standard memory, the memory according to the invention is slightly bulkier owing to the presence of several read circuits working in parallel. However, what is significant is the technical simplicity of this memory whose operation is, on the whole, similar to that of a standard memory. Using a higher permissible clock signal frequency, it is possible to use read circuits of the same type as in a standard memory. This means that it will be possible to attribute excessive power consumption only to the larger number of read circuits used but not to any increased complexity of the circuits of the memory.

In practice, the decoding of the q first bits of an address of a word to be read will be implemented in row and column decoding circuits of a standard type. The decoding of the k–q last bits received will correspond to the production of control signals for multiplexing circuits and read circuits.

In a standard memory, the address bits received are memorized in a shift register formed by k cells. This shift register is connected to the address input terminal. For memories capable of working in sequential read mode, this input register is furthermore organized so as to be capable of working as a binary address counter.

In a preferred version, the invention provides for the storage, firstly, of the q first address bits and, secondly, of the k–q last address bits. Thus, two shift sub-registers are used, with q and k–q cells respectively. The two sub-registers are connected to the address input terminal. This approach enables the storage of the address bits of a same row always in the same cell. This makes it possible to implement the invention easily. It would be far more complicated to use a single shift register, for it is planned to provide the q first address bits as soon as the $q^{th}$ bit has been received. The use of a single shift register will lead to modifying the contents of the cells of this register, by shifting, while the decoding takes place. In practice, it will therefore be necessary to provide for a buffer register between the input register and the decoding circuits in order to ensure the stability of the q bits used for the decoding.

Furthermore, it is not possible to limit the operation to a single shift-register type of input register, with q cells, directly connected to the address input terminal. This is because firstly, it is necessary to be able to memorize the q first address bits received in order to ensure the stability of the bits used for the address decoding. Secondly, it is also necessary to be able to memorize the k–q last address bits received in order to be capable of controlling the output multiplexing circuit in a definite (if k–q>1) and stable way.

In a preferred version, the invention provides a method wherein the memory possesses a so-called sequential read mode such that, following the reading of the contents of a first word corresponding to a first address, the memory automatically transfers a second binary information element at the data output terminal, this second binary information element being represented by the contents of a second word of the memory.

The serial access memories usually include a read mode such as this in which the address received from outside is stored in an address counter so that, as soon as the information corresponding to the received address has been output, the address stored is modified automatically so that, without outside intervention, the information elements corresponding to the contents of the following words are output automatically. In practice, the modification of the address is most usually an incrementation of the address.

The invention also proposes a memory in which the input register is a binary address counter.

Unlike in the case of a standard memory, in a sequential read mode there will be no methodical modification of the contents of the q cells of the sub-register corresponding to the q first address bits. These contents will not be modified unless the second word has q first address bits different from those of the first word. The k–q last address bits stored will be used to find out whether the modification of the q first address bits is necessary or not.

BRIEF DESCRIPTION OF THE DRAWINGS

Other features and advantages shall appear from the following detailed description, made with reference to the appended drawings, of which.

DETAILED DESCRIPTION

Figure 1:
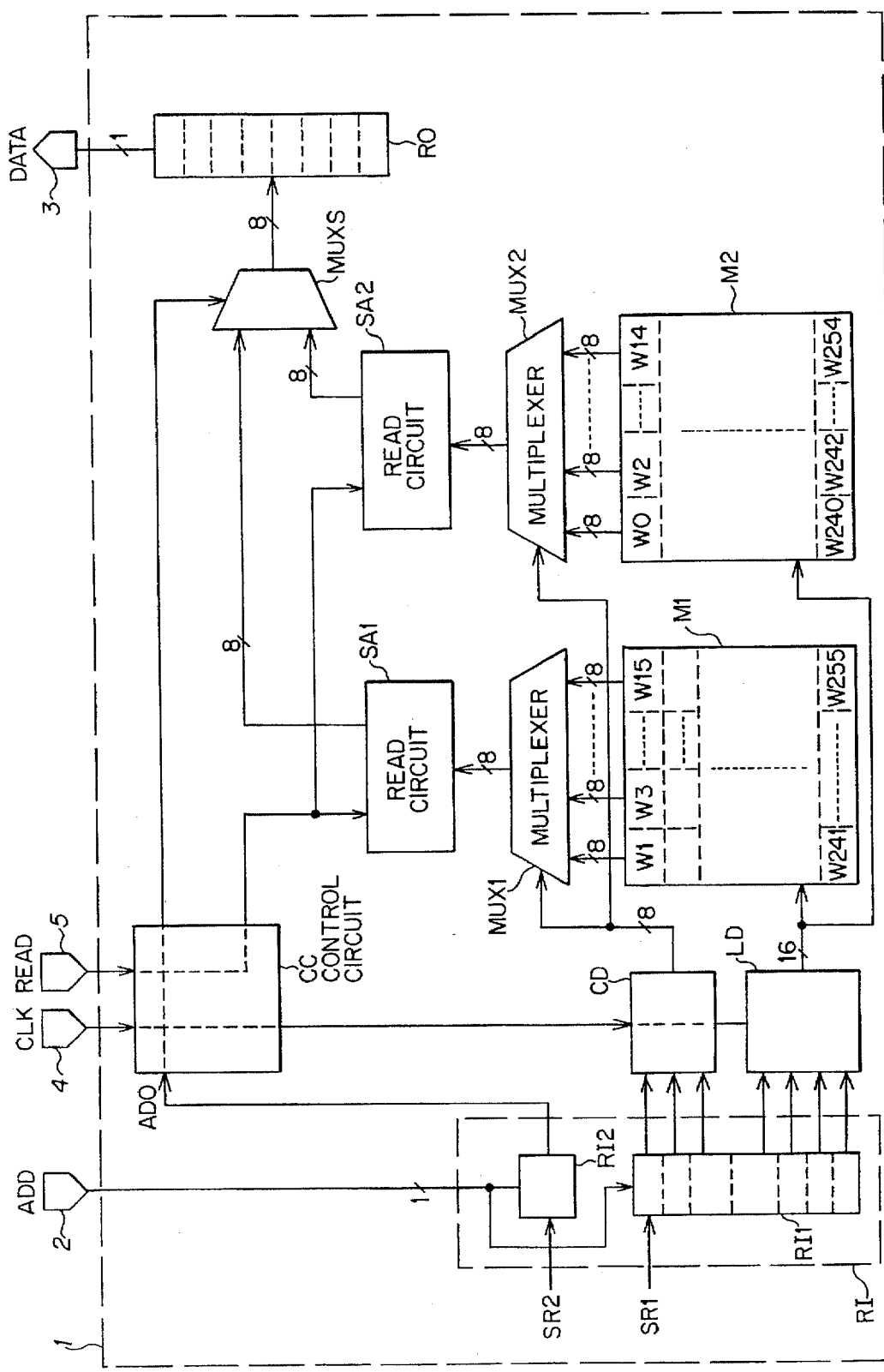
FIG. 1 shows a memory configuration made according to the invention.
Figure 2:
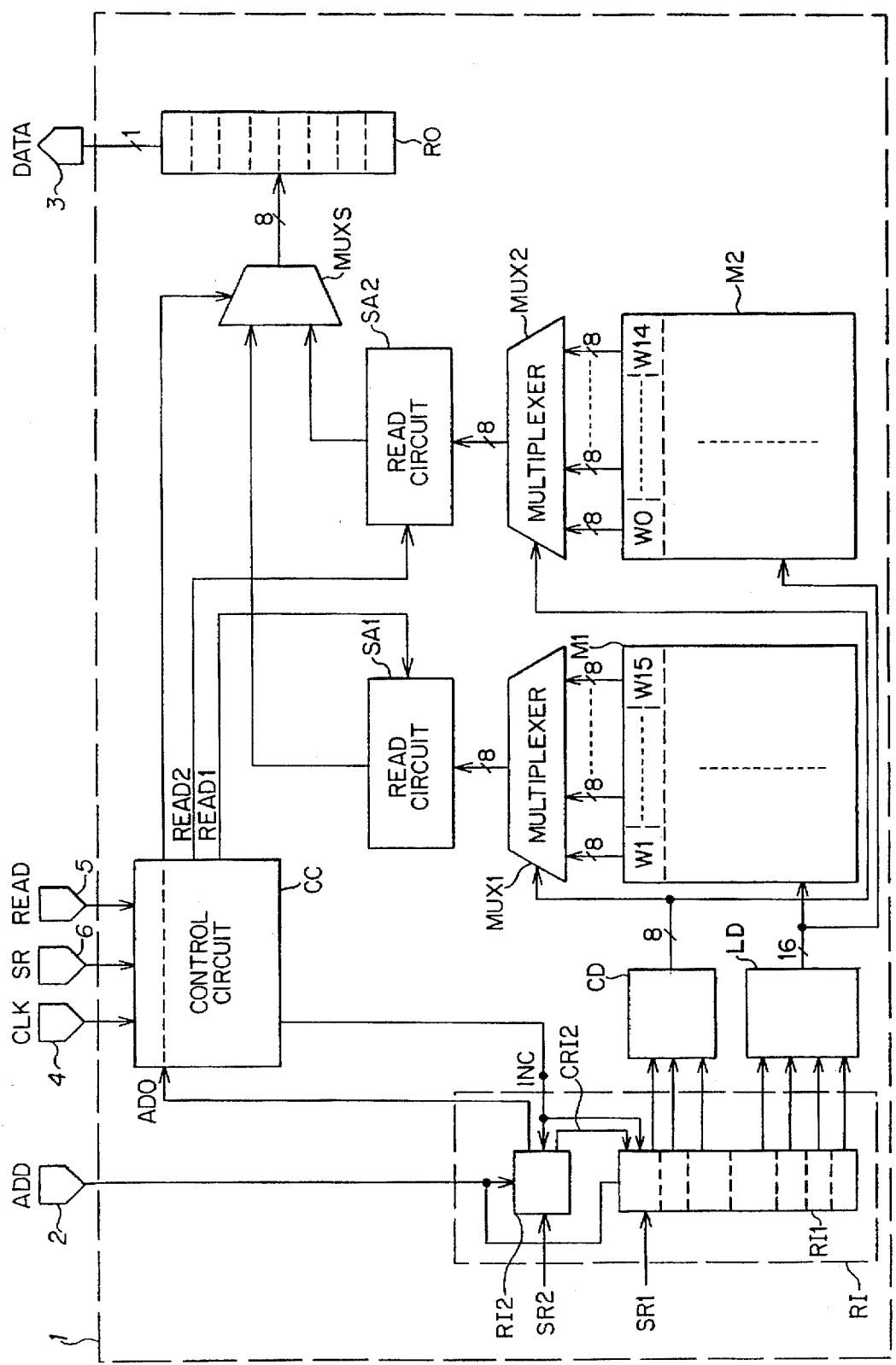
FIG. 2 shows another memory configuration made according to the invention, this memory being capable of using a sequential reading mode.

FIGS. 1 and 2 show a memory 1 that could, for example, be an EEPROM type memory made according to a known semiconductor technology.

It will be assumed, for example, that this memory 1 is organized in 1 rows of m words (W0 to W255) formed by b elementary cells.

In a standard way, 1, m and b will be whole numbers equal to powers of 2. It will be assumed hereinafter in the description that $1=m=2^4=16$, and $b=2^3=8$.

With each word, there will be associated an address ADD encoded on k bits, such that typically there will be $2^k=1*m$. In the description, it will be assumed that k=8, the four most significant bits of the address determining the row being considered, and the four least significant bits of the address determining the word to be read in the row considered.

According to the invention, the method starts with the decoding of the address ADD when q=k–p first bits of this address have been received, with q and p as integers and p<k. There are $2^k$ words in the memory. For q given address bits, there are $2^p$ words having their q first address bits equal to these q first address bits given. Hence, $2^p$ binary information elements will be extracted from the q first address bits received.

The words will therefore be grouped in $2^p$ groups of words, each group being associated with a read circuit in such a way that, in each group:

the words have q distinct first address bits, and the words have p last identical address bits.

In the examples described, p will be taken to be equal to 1.

Thus, for an address ADD received serially, the decoding of this address will be started while the least significant bit is not yet available at the input. This means that the decoding of the first bits received will make it possible to determine the row to be selected with certainty, while a degree of indeterminacy remains for the particular word that is to be read. It can be considered, with p=1, that the memory is formed by two half-arrays M1 and M2, each half-array being formed by 16 rows of 8 words, the half-array M1 corresponding, for example, to a last address bit equal to 1 and the other half-array M2 corresponding to a last address bit equal to 0. The memory array is divided into an even parity half-array and an odd parity half-array.

The memory 1 includes an address input terminal 2 for the serial reception of the address ADD of a word to be read, an input register RI to receive the address bits, a data output terminal 3 for providing, in a standard way, the binary information elements in a serial output, referenced DATA, corresponding to the addresses ADD received, an input terminal 4 for the reception of a clock signal CLK which is supposed to be produced externally to the memory, this clock signal CLK setting the rate of operation of the memory 1, an input terminal 5 for the reception of a read control logic signal READ (in one example, the words of the memory will be read if READ=1), a row decoding circuit LD to select one row among the L rows of each half-array, a column decoder CD to control two (namely $2^p$) multiplexers MUX1 and MUX2 and select, by means of these multiplexers, one word to be read, per half-array, of the row selected by the row decoder LD, a control circuit CC, not shown in detail, receiving the clock signal CLK and the read control signal READ and giving control signals to the different circuits of the memory in order to ensure adequate synchronization in the working of the memory 1, two read circuits SA1 and SA2, each associated with one of the half-arrays M1 and M2, for the extraction of two binary data elements from the two words selected, an output multiplexer MUXS with $2^p$ parallel type inputs and one parallel type output for the selection (depending on the states of the selection signals received from the control circuit CC) of one of the $2^p$ binary information elements extracted in order to give the extracted and selected information element to the exterior, and an output register RO. Typically, this register is a parallel input and series output shift register. The input of the output register RO is connected to the output of the output multiplexer MUXS and its output is connected to the output terminal 3. In this embodiment, this output register RO will of course be formed by eight cells (with information elements encoded on b=8 bits).

The logic constitution of the circuits shall not be described in exhaustive detail, as the construction of these circuits on the basis of the following description of operation should not entail any special problems for those skilled in the art.

The input register RI is formed by two sub-registers including a first sub-register RI1 with series input and parallel output to store the q first bits of the address ADD received, and a second sub-register RI2 (formed by only one cell) with series input and parallel output to store the k–q last bits of the address ADD received. The two sub-registers RI1 and RI2 are shift registers having their respective inputs connected to the address input terminal 2.

The sub-register RI1 has its parallel output connected to the decoding circuits LD and CD. Four of its cells are connected to the row decoding circuit LD and the other three are connected to the column decoding circuit CD. It must be noted that, as compared with a standard memory with an equivalent capacity, the column decoding circuit will be less bulky because it will process three bits instead of four. This sub-register RI1 receives a shift control logic signal SR1. The contents of the cells go from one cell to another on a leading edge of the clock signal if SR1=1.

The sub-register RI2 has its parallel output (in fact it is a series output since k–q=1) connected to the control circuit CC. AD0 shall denote the contents of the sub-register RI2. RI2 receives a shift control logic signal SR2. The contents of the cells go from one cell to another on a leading edge of the clock signal, if SR2=1.

Memory Without Sequential Read Mode (The Case Illustrated in FIG. 1).

At the reception of the q first address bits, the q bits are memorized in the sub-register RI1. At the reception of the p last address bits, the p bits are memorized in the sub-register RI2. The control signal SR1 is then held in a permanent state equal to 0, thus preventing the contents of the sub-register RI1 from being modified.

The reading of a word includes the series reception (SR1=1) in the first sub-register RI1 of the seven first address bits of the word to be read, and in parallel with the reception of the last address bit in the cell of the second sub-register RI2 (SR2=1 and SR1=0):

decoding of the seven first address bits received by the row and column decoding circuits LD and CD, and connection of the read circuits SA1 and SA2 respectively to the words of the two half-arrays M1 and M2, the first seven address bits of which correspond to the first seven address bits received, and extraction by means of the read circuits SA1 and SA2 of the binary information elements represented by the contents of these two words.

The reading of a word further includes decoding of the last address bit (AD0) by the control signal CC (namely the production of a selection signal given to the output multiplexer) and providing, on the output data terminal 3, of the binary information element represented by the contents of the word whose address corresponds to the eight address bits received, by means of the output multiplexer MUXS and the output register RO. In practice, for p=1, it is possible to activate the output multiplexer MUXS directly by connecting its control input to the output of the sub-register RI2.

The embodiment illustrated in FIG. 1 is one example of the present invention. Indeed, most of the commercially available serial access memories work also in sequential read mode.

Memory With Sequential Read Mode (The Case Shown in FIG. 2)

As compared with FIG. 1, the following differences will be noted. The memory has a control input terminal 6 to receive a control logic signal SR enabling entry into sequential read mode. It will be assumed that SR=1 corresponds to a sequential read mode. The input register RI may work as the binary address counter. The first and second sub-registers RI1 and RI2 will not be simple shift registers. The sequential read mode entails that the contents of the sub-registers RI1 and RI2 can be modified within the memory. The input register RI will be controlled by the control circuit CC by means of a control logic signal INC for the automatic modification (typically incrementation by 1) of the contents of said counter, for example, if the signal INC is in the logic state 1.

The sub-registers RI1 and RI2 receive the control logic signal INC to increment their contents by one unit which can occur on a leading edge of this signal. Furthermore, the sub-register RI2 can output a carry logic signal CRI2. This signal CRI2 will go into a given state, for example the state 1, if following an incrementation of the contents of the sub-register RI2, all the bits stored in this register are at zero. This corresponds to the case where, before incrementation, all the bits stored in this sub-register were at 1. More generally, it corresponds to the fact that if it is desired to read the word located at the address following that of the word read before incrementation, it will be necessary to modify the contents of the sub-register RI1. Thus, in addition to the signal INC, the signal CRI2 will output to the sub-register RI1 in such a way that its contents are incremented only if, at the same time, a leading edge of INC and CRI2=1.

The read circuits SA1 and SA2 each receive a read control signal respectively referenced READ1 and READ2.

It will be assumed that:

READ1=SR. READ.AD0+READ./SR,

READ2=SR. READ./AD0+READ./SR, and

. represents a logic AND, + represents a logic OR and / represents the complementation.

As regards the extraction of the information from an address, it is possible to distinguish two cases depending on whether the address is given to the memory by means of the address input terminal 2 or produced internally. These two cases are set forth below.

1—Address received from outside

This case corresponds to a type of operation similar to the one illustrated in FIG. 1.

To read the word, in a manner similar to the case shown in FIG. 1, the q first bits are used by the row decoding and column decoding circuits LD and CD, and the p last bits are used by the control circuit CC. Once the $2^p$ information elements extracted from the cells are read (READ1= READ2=READ), the information corresponding to the k bits received is stored in the output register RO by means of the output multiplexer MUXS (selection according to AD0). Then, by shifting in the output register RO, the information element is output at the data output terminal 3.

2—Sequential reading

In sequential read mode, following the output of an information element corresponding to a first given address, the address will be modified internally, so as to successively output additional information elements. It will be assumed that, conventionally, the first address will be incremented by one unit in order to give the information stored in the word located at the next address, and so on and so forth.

The steps include the reception from outside of the k address bits and the output of the corresponding information at the data output terminal, and, in parallel with the output of the information, at the data output terminal, the incrementation by one unit of the contents of the second sub-register RI2 and the conditional incrementation (as a function of CRI2) of the contents of the first sub-register RI1, and the decoding of the contents, after incrementation, of the sub-register RI1. The desired information is extracted by means of the appropriate read circuit SA1 or SA2 as a function of the contents AD0 of the sub-register RI2 after incrementation, which will determine the states of READ1 and READ2.

The incrementation can be done, for example, when half of the information bits memorized in the output register have been output at the data output terminal. There is not any waiting for the output of the last bit of the output register before carrying out the next read operation. That would effectively limit the maximum permissible clock frequency. In other words, in sequential read mode, there is obtained the benefit of an internal access time that is at least equal to the internal access time in non-sequential read mode, as when the address is obtained externally.

In the example shown, let it be assumed that a first address of a first word of the half-array (AD0 to 0) has been received externally. The incrementation of this first address (AD0 going to 1) will give a second address of a second word located in the half-array M1. The q first bits of the first and second addresses will be identical. To read the contents of the second word, the q bits stored in the sub-register RI1 will not be modified (CRI2=0). READ1=/READ2=1.

To read the next word, located in the half-array M2, the procedure includes incrementation of the contents of the sub-register RI2 (AD0=0 and CRI2=1) and RI1, and modification of the $q^{th}$ address bit and possibly of one or more of the other bits, by means of the control signal INC, decoding by the decoding circuits LD and CD of the q bits stored in the sub-register RI1 after incrementation, reading the word corresponding to the address after incrementation by means of the read circuit SA2 (READ2=/READ1=1), storage of the extracted binary information in the output register, and outputting of the information.

Of course, the invention is not limited to the examples that have just been described and other improvements and extensions may be envisaged without departing from the framework of the invention. Thus, in particular, the storage cells could be assembled in a number of groups greater than 2, the internal access time within the memory being increased with, however, a corresponding increase in power consumption and in the amount of space occupied by the memory.

Furthermore, it is possible to envisage the use of $2^p$ output registers each associated with one of the read circuits, the output multiplexer being placed between these output registers and the data output terminal. It is then possible, in sequential read mode, to envisage the reading, of $2^p$ words and the successive output of these words at the data output terminal. There will be no effective reading of the words unless there is a modification of the q first address bits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of reading the contents of words of a memory in integrated circuit form, each memory being organized in matrix form in words, the contents of each word representing a binary information element, each word being accessible at a particular address encoded in binary mode on k bits, k being an integer greater than 1, the address bits being received in series by the memory at an address input terminal, comprising the steps of:

serially receiving q first bits of the address of the word to be read, with q as an integer smaller than k;

in parallel with the reception of k–q last bits of the address:

decoding the q first bits of the address that are received and connecting read circuits to the words for which the q first address bits correspond to the q first address bits received;

extracting the binary information elements represented by the contents of the words for which the q first address bits correspond to the q first address bits received; and decoding the k–q last bits of the address of the word to be read and supplying, at a data output terminal of the memory, the binary information element that is represented by the contents of the word whose address bits correspond to the k address bits received.

2. A method according to claim 1, wherein the memory has a sequential read mode such that, following the step of reading the contents of a first word corresponding to a first address, the memory automatically provides a second binary information element at the data output terminal, this second binary information element being represented by the contents of a second word of the memory.

3. A method according to claim 2, wherein the decoding of the address of the second word takes place during the step of supplying, at the data output terminal, the binary information represented by the contents of the first word.

4. A method according to claim 2 wherein, in sequential read mode, one binary information element at a time is extracted.

5. A memory in integrated circuit form organized in words, the contents of each word representing a binary information element, each word being accessible at a particular address encoded in binary mode on k bits, k being an integer greater than 1, the memory comprising:

an address input terminal to receive the address bits in series, a data output terminal to provide the binary information elements corresponding to the contents of the addressed words, an input register coupled to the address input terminal to store received address bits received at the address input terminal, decoding circuits coupled to the input register for decoding the received address bits, and circuits coupled to read circuits and said decoding circuits for connecting the words to said read circuits, wherein the words are organized in groups of words in such a way that the words in each group have k–q identical last address bits, with q as an integer smaller than k, and q first distinct address bits, each group of words has an associated read circuit so that, when the memory receives k address bits, the memory extracts the binary information that is represented by the contents of the word of the group corresponding to the q first address bits received, and the memory further comprises control and output multiplexing circuits coupled to said read circuits and said data output terminal to supply, at the data output terminal, the binary information that is represented by the contents of the word whose address corresponds to the k bits received.

6. A memory according to claim 5, wherein the input register is formed by two shift sub-registers respectively formed by q and k–q cells.

7. A memory according to claim 6, wherein the input register is a binary address counter.

8. A memory according to claim 7, wherein the control circuit comprises means for modifying the contents of the input register.

9. A memory according to claim 5, further comprising an output register connected to the read circuits in order to store the binary information elements extracted by these read circuits.

10. A memory according to claim 5, wherein the memory is an electrically programmable and erasable memory.

11. A memory for storing a plurality of words, each word having an address of k bits associated therewith, the memory comprising:

a first memory array for storing a first group of words of said plurality of words;

a second memory array for storing a second group of words of said plurality of words, wherein for each word in the first group of words there is a corresponding word in the second group of words having a same k minus q address bits associated therewith;

a first read circuit coupled to the first memory array, for reading a first word having a first address associated therewith from the first memory array; and a second read circuit coupled to the second memory array for reading a second word from the second memory array substantially simultaneousl read by the first read circuit, the second word having the second address having the same k minus q address bits associated therewith as the first address.

12. The memory of claim 11, further comprising an input register for serially receiving an address of a word to be read from the memory.

13. The memory of claim 12, wherein the input register is a shift register, comprising a first subregister that has a capacity to hold q bits and a second subregister that has a capacity to hold k minus q bits.

14. The memory of claim 13, further comprising a multiplexer coupled to the first and second read circuits and an output register coupled to the multiplexor.

15. The memory of claim 14, further comprising a control circuit coupled to the second subregister, the multiplexor and the first and second read circuits, the control circuit for receiving the k minus q bits from the second subregister.

16. The memory of claim 12, wherein the input register is a binary address counter, having a first subregister that has a capacity to hold q bits and a second subregister that has a capacity to hold k minus q bits.

17. The memory of claim 16, further comprising a multiplexer coupled to the first and second read circuits and an output register coupled to the multiplexor.

18. The memory of claim 17, further comprising a control circuit coupled to the second subregister, the multiplexor and the first and second read circuits, the control circuit for receiving the k minus q bits from the second subregister, and controlling the binary address counter to increment its contents.

19. A method of reading a binary word having a k bit address associated therewith from a memory, comprising the steps of:

(A) decoding q first address bits;

(B) reading every word from the memory having a same first q address bits associated therewith; and (C) selecting a word read in step (B) having k minus q address bits corresponding the binary word.

20. The method of claim 19, wherein step (C) includes decoding the last k–q address bits.

21. The method of claim 20, further comprising selecting a word having a same address as the word selected in step (C) incremented by one.

22. The method of claim 19, further comprising storing the k bit address in a register before step (A) occurs.

23. The method of claim 22, further comprising incrementing the contents of the register by one and selecting a word having a same address as the word selected in step (C) incremented by one.

* * * * *